United States Patent
Maschera et al.

(10) Patent No.: US 8,406,391 B2
(45) Date of Patent: Mar. 26, 2013

(54) ACTIVE IMPEDANCE SYNTHESIS CIRCUIT, FOR EXAMPLE FOR XDSL SPLITTERS

(75) Inventors: Davide Maschera, Padua (IT); Daniele Dario, Padua (IT)

(73) Assignee: STMicroelectronics S.r.l., Agrate Brianza (IT)

( * ) Notice: Subject to any disclaimer, the term of this patent is extended or adjusted under 35 U.S.C. 154(b) by 972 days.

(21) Appl. No.: 11/474,051

(22) Filed: Jun. 22, 2006

(65) Prior Publication Data

US 2007/0009051 A1 Jan. 11, 2007

Related U.S. Application Data

(63) Continuation-in-part of application No. PCT/IB2004/004032, filed on Dec. 6, 2004.

(30) Foreign Application Priority Data

Dec. 22, 2003 (EP) .................................... 03029556

(51) Int. Cl.
*H04M 11/00* (2006.01)
(52) U.S. Cl. ................. 379/93.01; 379/93.05; 379/93.06
(58) Field of Classification Search ............... 379/93.01, 379/93.05, 93.06
See application file for complete search history.

(56) References Cited

U.S. PATENT DOCUMENTS

| | | | |
|---|---|---|---|
| 5,258,713 A * | 11/1993 | Rosch et al. ................. | 326/62 |
| 5,623,543 A | 4/1997 | Cook | |
| 5,627,501 A | 5/1997 | Biran et al. | |
| 5,889,856 A | 3/1999 | O'Toole et al. | |
| 6,144,735 A | 11/2000 | Bella | |
| 6,628,783 B1 | 9/2003 | Van Wonterghem | |
| 6,694,013 B1 * | 2/2004 | Lofmark ................. | 379/399.01 |
| 2001/0045843 A1 | 11/2001 | Hernandez-Marti | |

FOREIGN PATENT DOCUMENTS

| | | |
|---|---|---|
| DE | 3323651 A | 1/1985 |
| WO | PCT/SE99/00036 | 8/1999 |

OTHER PUBLICATIONS

PCT/IB2004/004032 (Publication No. 2005/064911A1, International Search Report, Mar. 30, 2005.

* cited by examiner

*Primary Examiner* — Alexander Jamal
(74) *Attorney, Agent, or Firm* — Graybeal Jackson LLP

(57) ABSTRACT

An arrangement includes a transformer having a primary winding and a secondary winding, the transformer exhibiting an impedance across the primary winding, and an impedance synthesis circuit. The impedance synthesis circuit includes a transfer function element having a frequency spectrum. The transfer function element has associated a gain element and a current source controlled by the transfer function element. The impedance synthesis circuit is connected to said secondary winding, so that the transformer mirrors the impedance synthesized by the impedance synthesis circuit into the impedance across said primary winding. The primary winding is adapted to define the high voltage side of an XDSL splitter, while the impedance synthesis circuit connected to the secondary winding is inherently a low voltage circuit.

40 Claims, 4 Drawing Sheets

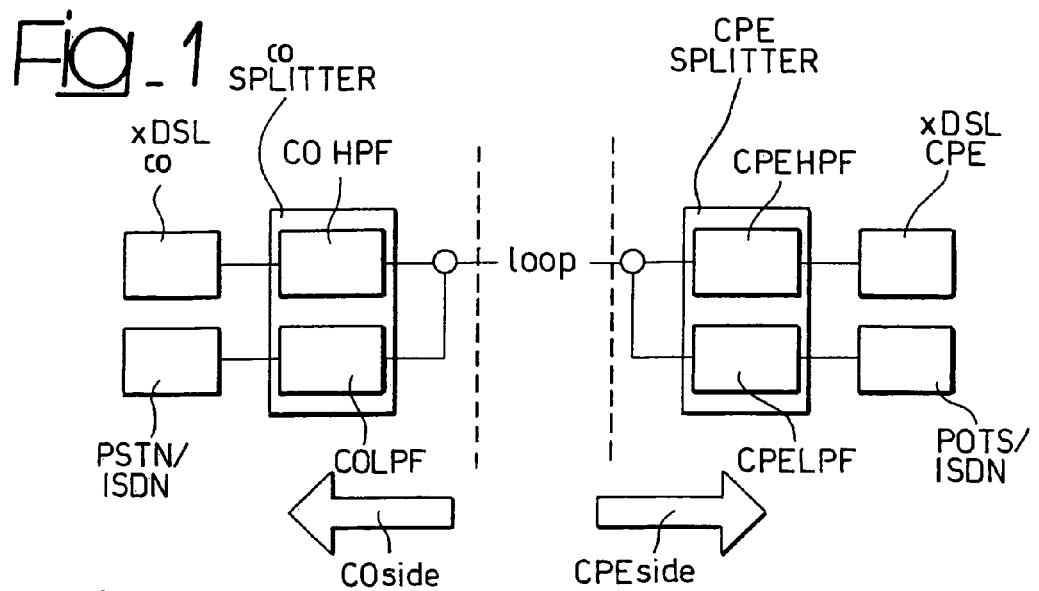
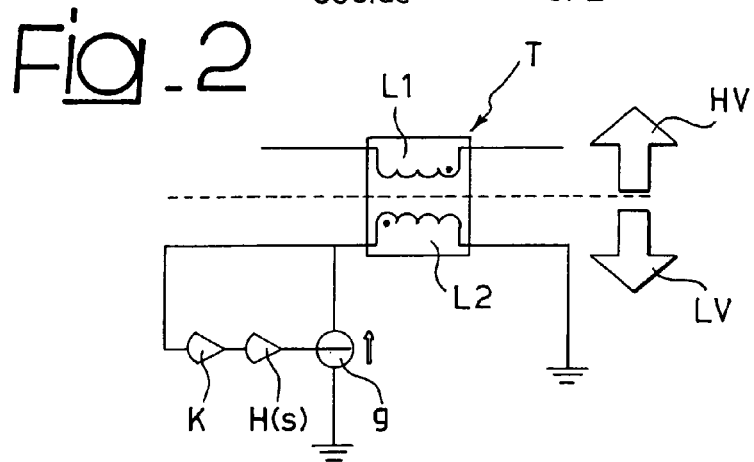
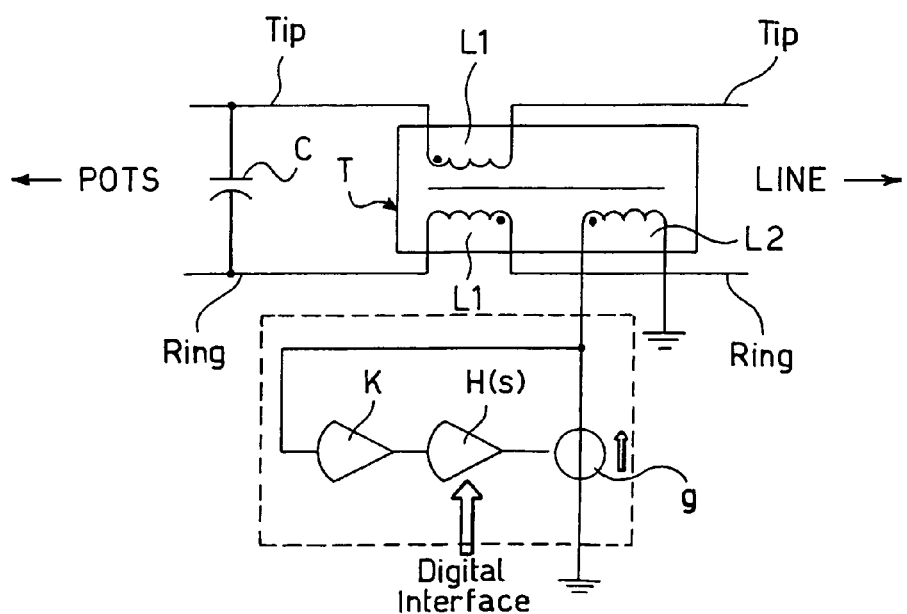

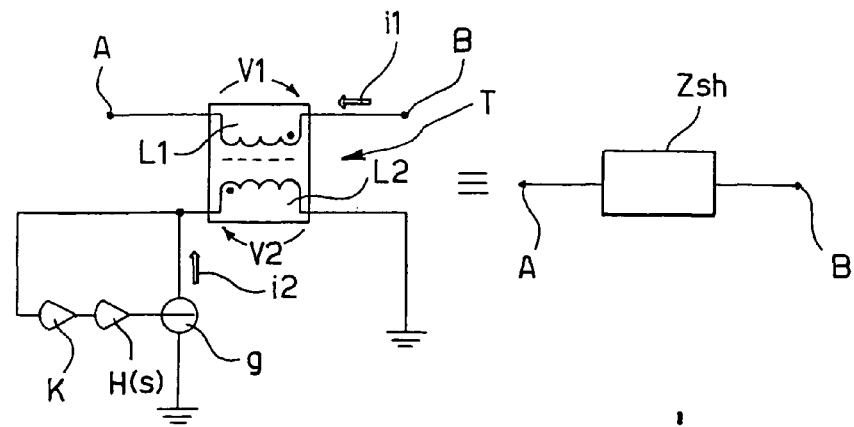
Fig_4
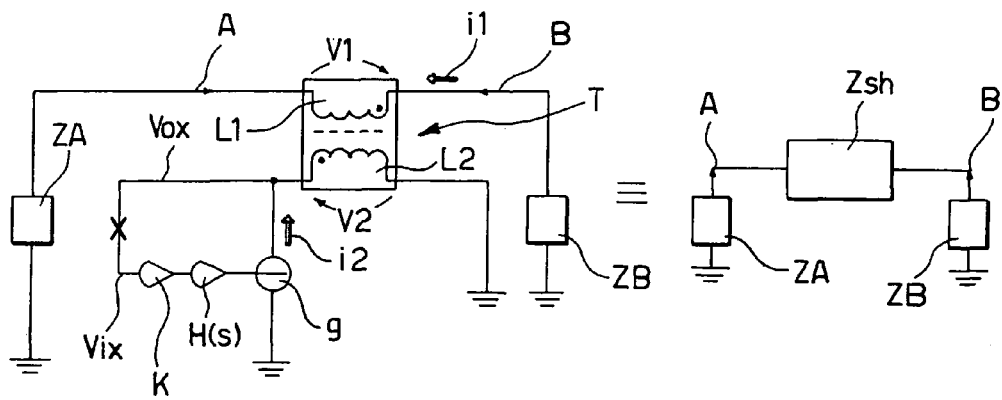
Fig_5
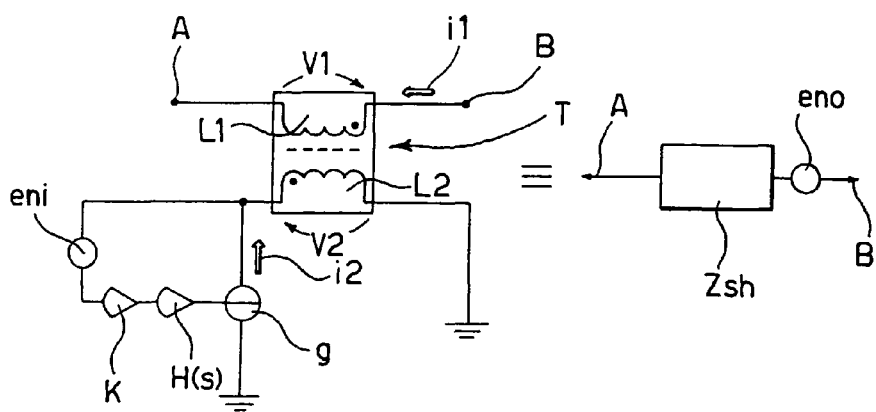
Fig_6

ACTIVE IMPEDANCE SYNTHESIS CIRCUIT, FOR EXAMPLE FOR XDSL SPLITTERS

PRIORITY CLAIM

This is a continuation-in-part application which claims priority from PCT/IB2004/004032, published in English, filed Dec. 6, 2004, based on European patent Application No. 03029556.2, filed Dec. 22, 2003, which are incorporated herein by reference.

TECHNICAL FIELD

An embodiment of the disclosure relates primarily to xDSL (i.e. X Digital Subscriber Line) splitter applications. However, embodiments of the disclosure are adapted for use, in general, in filtering applications or in synthesizing floating impedances through an ELF (Extremely Low Frequency) decoupled circuitry.

BACKGROUND

The instant description will extensively rely on acronyms/abbreviations that are common in the technical area considered. The following is a list of those acronyms/abbreviations provided by way of direct reference, along with short explanations of the corresponding meanings:
xDSL X-Digital Subscriber Line
POTS Plain Old Telephone Service
PTSN Public Switching Telecommunication Network
ISDN Integrated Service Digital Network
CO Central Office
CPE Customer Premise Equipment
DS Down Stream
UP Upstream
HV High Voltage
LV Low Voltage
LPF Low Pass Filter
HPF High Pass Filter
COMBO Integrated POTS and ADSL line cards
PSD Power Spectral Density
VCCS Voltage Controlled Current Source
ELF Extremely Low Frequencies
PAD Phase Adjuster filter
SMD Surface Mounted Device
GIC Generalized Immittance Converter FIG. 1 shows the general layout of a "splitter" for xDSL systems that separates xDSL and POTS/ISDN systems by means of a bi-directional filtering action. The acronyms shown in FIG. 1 and the functions performed by the functional blocks designated thereby are well known to those of skill in the art, thus making it unnecessary to provide a detailed description herein XDSL technology can co-exist with other communication channels like POTS and ISDN, which share the same cable/loop placed between CO and CPE as shown in FIG. 1

The typical bandwidth used in xDSL applications ranges from 20-130 KHz to 1-11 MHz whereas POTS/ISDN applications involve frequencies from DC to 20-130 KHz. Different signals are allocated in the low frequency band too (DC—50 Hz), such as:
line test signals,
ringer,
dial pulsing,
on/off hook signals, and
in specific cases, billing tones (12-16 KHz).

The basic requirements for a splitter are well known in the art, as witnessed e.g. by the above-referenced ITU-T Recommendation and by additional documents (which are incorporated by reference) such as:
ETSI TR 101 728 (V1.1.1): "Access and Terminals (AT); Study for the specification of the low pass section of POTS/ADSL splitters".
ANSI T1.413: "Network to Customer Installation Interfaces—Asymmetric Digital Subscriber Line (ADSL) Metallic Interface".
ETSI TS 101 388 (V1.2.1): "Transmission and Multiplexing (TM); Access transmission systems on metallic access cables".
ETSI TS 101 952 (V1.1.1): "Part 1: ADSL splitters for European deployment;
Sub-part 3: Specification of ADSL/ISDN splitters".
ETSI TS 101 952 (V1.1.1): Part 1: ADSL splitters for European deployment; Sub-part 4: Specification of ADSL over "ISDN or POTS universal splitters.
ITU-T Brugge, Belgium, 17-21 Jun. 2002: "Draft Rec. G.992.3-ADSL2".
ITU-T Recommendation G.992.5 ASYMMETRIC DIGITAL SUBSCRIBER LINE (ADSL) TRANSCEIVERS-EXTENDED BANDWIDTH ADSL2 (ADSL2plus).
COMMITTEE T1—TELECOMMUNICATIONS Working Group T1E1.4 (DSL Access): Very-high-bit-rate Digital Subscriber Line (VDSL) Metallic Interface Part 1: Functional Requirements and Common Specification.
ETSI TS 101 952-2-3 v1.1.1: "Part 2: VDSL splitters for European deployment; Sub-part 3: Specification of VDSL/ISDN splitters for use at the Local Exchange (LE) and the user side near the Network Termination Port (NTP)".
ETSI TS 101 952-2-1 v1.1.1: "Part 2: VDSL splitters for European deployment; Sub-part 1: Specification of the low pass part of VDSL/POTS splitters".

The basic aim of a splitter is to separate xDSL signals from POTS/ISDN signals. Specifically, the splitter attenuates spurious signals falling in the xDSL band due to POTS/ISDN events like on/off-hook, ringer, ring injection, ring trip dial pulses and so on, while vice versa avoids that xDSL signals may reach the POTS/ISDN port showing high impedance in the xDSL band.

A splitter is usually comprised by a HPF and a LPF: the former is used as xDSL-loop interface by cutting out frequencies lower than 30 KHz-130 KHz, the latter acts as a POTS/ISDN-loop interface avoiding noise injection in xDSL band (from POTS to loop) and providing, in the same bandwidth, a high impedance seen from loop to POTS.

Usually, ADSL CO modems already include a CO HPF. In the rest of the instant description, the term splitter applies primarily to the LPF part only.

Reference works such as, e.g. J. Cook and P. Sheppard: "ADSL and VDSL Splitter Design and Telephony Performance", IEEE Journal on selected areas in communications, Vol. 13, No. 9, December 1995, XDSL, which is incorporated by reference, show that splitters can be divided into passive and active categories.

In the passive case, a relatively huge number of HV passive devices is often necessary to produce a filter of adequate order ($4^{th}$-$7^{th}$) see, e.g. U.S. Pat. No. 6,144,735 or U.S. Pat. No. 5,627,501, which are incorporated by reference.

In the active case—see, e.g. U.S. Pat. No. 5,623,543 or U.S. Pat. No. 6,628,783, which are incorporated by reference—active devices permit a reduction in the order of the passive filter.

Other arrangements—see, e.g. U.S. Pat. No. 5,627,501 (already cited in the foregoing) or U.S. Pat. No. 5,889,856, which is incorporated by reference, require digital signal processing.

It has been observed that both the article of Cook and Sheppard and U.S. Pat. No. 5,623,543 provide an active approach that implements high-performance splitters based on GIC and a line-voltage sensing with two HV capacitors. But these arrangements do not take into account complexity, density, and power consumption (e.g., 80 mW quiescent power).

U.S. Pat. No. 5,627,501 adopts a passive approach implemented with a low-pass filter (LPF) plus a variable impedance circuit. A measurement unit placed on the ADSL side detects the LPF coil saturation and inserts additional impedance that limits the POTS current flow. This solution is not applicable for a stand-alone splitter requiring the ADSL system supervision; additionally, expensive additional components such as switches must be added.

U.S. Pat. No. 6,144,735 provides a solution based on a configurable filter. It makes extensive use of passive components plus an off-hook detector network that switches the splitter in two different filtering states.

U.S. Pat. No. 6,628,783 provides an active solution without supply and able to suppress (with a depletion MOS device) high frequency spurious signals due to POTS events. It requires a HV MOS with low $R_{ON}$ value and a $3^{rd}$-order extra passive section to satisfy standard splitter requirements.

U.S. Pat. No. 5,889,856 discloses a purely digital approach applicable only to COMBO arrangements that offer a single termination point on the CO-side. An analog splitter is not required, but the complexity of the digital part is increased. Additionally, analog circuitry (which is not easy to integrate) is required to provide DC feed, battery voltage, and ring.

SUMMARY

An embodiment of the present disclosure provides an improved solution dispensing with intrinsic disadvantages of the prior art arrangements considered in the foregoing.

An embodiment of the disclosure includes:
a transformer having a primary winding and a secondary winding, the transformer exhibiting an impedance across said primary winding, and
an impedance synthesis circuit including:
  a transfer-function element having a frequency spectrum, said transfer-function element having an associated gain element, and
  a current source controlled by said transfer-function element,
the impedance synthesis circuit coupled to said secondary winding, whereby said transformer mirrors the impedance synthesized by said impedance synthesis circuit into said impedance across said primary winding.

Said current source may be controlled by the transfer function element via a feedback path and the associated gain element may be a distributed gain over said feedback path.

And the current source may be coupled to a current-injection point selected out of:
either terminal of said secondary winding, and
a point coupled to said secondary winding via an impedance.

An embodiment provides for the transfer-function element being coupled to a sense voltage at said secondary winding. To that effect, the transfer-function element may be coupled to a terminal of the secondary winding. This may be via said gain element and/or a voltage divider. Alternatively, the transfer-function element may be coupled for on-line sensing of a voltage across an impedance in series with said primary winding.

BRIEF DESCRIPTION OF THE DRAWINGS

One or more embodiments of the disclosure will now be described, by way of example only, with reference to the annexed drawings, wherein:

FIG. 1 has been described previously,

FIG. 2 is a block diagram of a synthesis circuit adapted for use in the arrangement described herein according to an embodiment of the disclosure, FIG. 3 is a block diagram of an active splitter circuit adapted for use in the arrangement described herein according to an embodiment of the disclosure, FIG. 4 is a block diagram of a floating impedance synthesis circuit adapted for use in the arrangement described herein according to an embodiment of the disclosure, FIGS. 5 and 6 are exemplary block diagrams for stability analysis and noise analysis of the arrangement described herein according to an embodiment of the disclosure.

DETAILED DESCRIPTION

Figure 7:
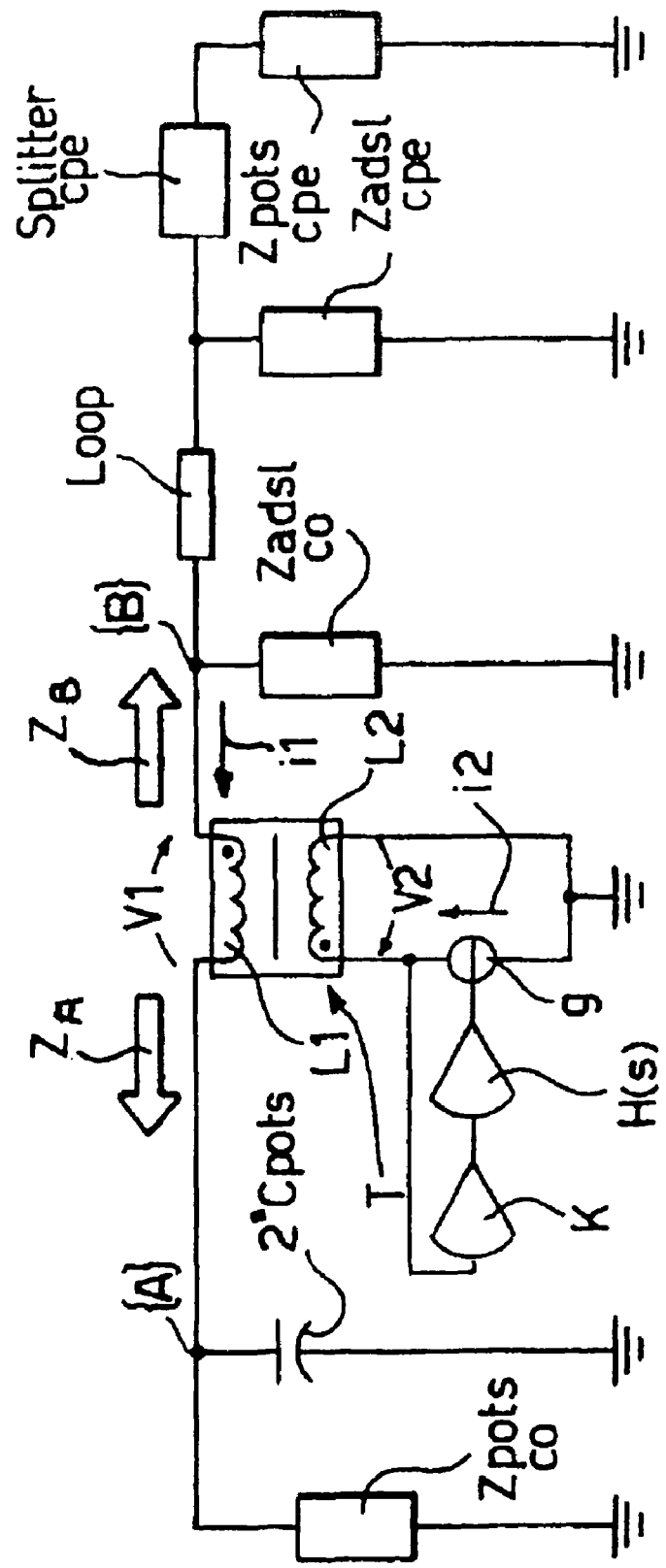
FIG. 7 is a simplified system model of the arrangement described herein according to an embodiment of the disclosure.

An embodiment of the disclosure implements an impedance on HV wires by reducing the number of HV components/devices.

FIG. 2 shows a basic idea underlying an embodiment of the disclosure. There, a transformer T provides the DC decoupling between the HV and LV circuit sections. Blocks K, H, g build the synthesis around the secondary winding $L_2$, which is mirrored on the primary winding $L_1$ arranged on the HV wire.

FIG. 3 shows a block schematic of an xDSL splitter, based on the synthesis circuit shown above, with a reduced set of passive devices according to an embodiment of the disclosure. Here, the whole splitter is implemented with only two passive devices, the transformer T and a capacitor C, plus a LV-part (elements K, H, g, to be detailed in the following) that is completely integrable without specific technological requirements.

This approach leads to an appreciable impact in terms of area reduction of the POTS/ISDN splitter: this is today one of the main bottlenecks in the CO DSLAM line density.

Moreover, making the block H programmable permits the realization of desired impedance values without changing the external components, thus supporting splitter functionalities for multi xDSL platforms.

With respect to the prior art, an advantage offered by an embodiment of the arrangement described herein lies in the reduction of the splitter board space due to the low number of passive devices used. In fact, as explained above, component integration (dashed box) on the "active" side, leads to a very compact active POTS/ISDN splitter for xDSL applications.

Others advantages relate to:
the dynamic programmability of the impedance, which permits digital switching from one xDSL technology to another;

longitudinal balance, only depending on the transformer characteristics;

flexibility in terms of capability to work in stand-alone mode or in COMBO systems; and low cost.

An explanation of the basic principles underlying the synthesis circuit described herein will represent an introduction to a more detailed description of an exemplary embodiment of the present disclosure. To that end, the basic equations useful for understanding active splitter structure and operation will be given, while describing application of the circuit to an active splitter.

Impedance Synthesizer

The architecture shown in FIG. 4, exemplifies the concept of impedance synthesizer with a single-ended approach for simplicity.

The whole circuit seen at terminals A, B can be ideally thought as a floating AC-impedance realized with the active blocks H, K, g. The stage K is intended as a distributed gain on the whole feedback path, g is a VCCS (Voltage Controlled Current Source) and H(s) a module (comprised of one or more filters) whose transfer function determines the "shape" (i.e. the frequency spectrum) of the impedance Zsh over the frequency field.

The synthesis circuit works around $L_2$ and sends/receives signals to/from the branch A, B through the magnetic coupling with $L_1$. The equation system in Eq 1 helps in understanding the concept and can be used to calculate the synthesized impedance seen from one of the two terminals when grounding the other one:

$$\begin{cases} v_1 = sL_1 \cdot i_1 + sM \cdot i_2 \\ v_2 = sL_2 \cdot i_2 + sM \cdot i_1 \\ M = \sqrt{L_2 L_1} \\ Zsh = \dfrac{v_1}{i_1} \\ i_2 = v_2 \cdot KH(s)g \end{cases} \quad \text{Eq 1}$$

Synthesized Impedance

As shown in Eq 1, the signal $v_2$ (on the LV side) contains information about current flowing in the primary winding $L_1$ (placed on the HV branch). The signal $v_2$ is processed by the active part and is then transferred via mutual coupling (M) to the HV side, without a direct DC coupling with the line.

In this way a bi-directional AC floating impedance is generated based on the following expression:

$$Zsh = sL_1 \cdot Ksh \quad \text{Eq 2}$$

where the synthesis factor Ksh is defined as:

$$Ksh = \frac{1}{1 - \alpha \cdot sL_2} \quad \text{Eq 3}$$

with $$\alpha = KH(s)g$$

Eq 2 and Eq 3 highlight that the impedance Zsh is modelled around $sL_1$ acting on $\alpha$ and shaped in terms of frequency range through the transfer function H(s). In agreement with Table 1 below, the value for a permits an increase, a decrease, or an inversion of the $sL_1$ impedance, depending on application.

TABLE 1 synthesis effect on sL1 vs. conditions on α.

| Conditions on Ksh | | Conditions on alpha | Effect on SL1 |
|---|---|---|---|
| Ksh > 0 | Ksh > 1 | $0 < \alpha < 1/sL_2$ | Incremented |
|  | Ksh < 1 | $\alpha < 0$ | Decremented |
| Ksh < 0 | \|Ksh\| > 1 | $1/sL_2 < \alpha < 2/sL_2$ | Inverted + incremented module |
|  | \|Ksh\| < 1 | $2/sL_2 < \alpha$ | Inverted + decremented module |

For example, by means of the condition expressed in Eq 4 a high impedance can be reached in a frequency band determined by H(s).

$$\alpha \cdot sL_2 \cong 1 \quad \text{Eq 4}$$

The equation above is a key towards an active splitter.

AC Stability

Stability can be analysed by taking the single ended case of FIG. 5 as a reference. Generally, both terminals A and B of the floating synthesized impedance are loaded towards ground via impedances $Z_A$ and $Z_B$ that play an important role in stability. In the situation considered the open loop gain ($G_{OL}$) may extracted by cutting the path feedback at the point indicated with a cross [X] and by solving the circuit with respect the ratio $v_{ox}/v_{ix}$. This leads to the expression:

$$G_{OL}(s) = \frac{v_{OX}}{v_{IX}} = \alpha \cdot (sL_2) \cdot \frac{Z_{LOAD}}{Z_{LOAD} + sL_1} \quad \text{Eq 5}$$

with $$Z_{LOAD} = Z_A + Z_B$$

Eq 5 highlights the dependency of $G_{OL}$ on $Z_A$, $Z_B$, $L_1$ and H(s).

Noise

From the point of view of noise, as shown in FIG. 6, the single ended circuit can be substituted by an equivalent circuit. This equivalent circuit is comprised of the synthesized impedance with a noise generator $e_{no}^2$ coupled in series.

If $e_{ni}^2$ denotes the equivalent input noise at the input of the block K, then the equivalent output noise generator $e_{no}^2$ depends linearly on $e_{ni}^2$ as $$e_{no}^2 = e_{ni}^2 \cdot \left(\frac{L_1}{L_2}\right) \cdot \left|\frac{\alpha \cdot sL_2}{1 - \alpha \cdot sL_2}\right|^2 \quad \text{Eq 6}$$

Clearly, the winding ratio:

$$n = \sqrt{L_1/L_2} \quad \text{Eq 7}$$

has a strong influence on noise injected on the branch A, B.

Active Splitter Implementation

POTS & ISDN splitters represent a natural field of application for the described impedance synthesizer. In fact, both LV and HV signals flow in splitters but the filtering actions are activated only on the LV component. In other words, splitters should be transparent for HV signals and provide high impedance for LV signals as specified in the standards already mentioned in the introductory portion of the description.

The main drawbacks of a fully active splitter approach are:

the presence of HV signals like DC battery ($60V_{DC}$) and ring ($100V_{RMS}$), which requires a dedicated and expensive HV SOI technology, power consumption, and
complexity.

For the reasons above, a splitter based on a hybrid arrangement as shown in FIG. 3 represents an optimum trade off in terms of performance, consumption, cost and complexity.

Although reference will be made in the following primarily to a POTS-xDSL splitter complying with the G.992.1 standard (which is incorporated by reference), those of skill in the art will promptly appreciate that the instant disclosure can be easily adapted to other standards or ISDN requirements.

The active splitter described herein is based on a simple architecture comprised of a transformer T, acting as a ELF (Extremely Low Frequency) decoupler and an active part able to synthesize an impedance around $L_2$ in a frequency range higher than the ELF range considered.

The transformer T will 'block' the DC as well as the ring signal from $L_1$ to $L_2$. The supply requirements of the active-part will be determined only from the choice of the winding ratio n and the PSD masks of the ADSL and Voice signals normally present on line.

FIG. 7 gives a simplified single-ended block schematic of a xDSL's system adapted to create a model according to an embodiment of the disclosure.

The symbols shown in FIG. 7 are as follows:

Zadsl (co/cpe) are standard impedances through which the ADSL modem injects UP and DS on the loop, the box designated loop indicates the impedance of the test loop, Zpots (co/cpe) indicate the impedance that the PTSN and POTS side will present: these depend on POTS state (on/off hook, ringing, ring trip . . . ), $i_1$ is the current on the primary winding L1, which in the ADSL frequency band represents the residual current flowing from the line to POTS due to the finite impedance Zsh, $i_2$ is the current on the LV winding that can be also seen as the lower limit for the stage current consumption g.

A number of entities will now be defined in order to describe the whole system. Each of these will be discussed, analysed and adapted in connection with an xDSL-POTS splitter compliant with G.992.1.

Synthesis factor: this is the ratio of the synthesized impedance and the physically used impedance $sL_1$.

A simplified version of Eq 3 is derived by setting (without losses in terms of generality), $H=H_1 \cdot H_2$ and $H_1=1/sL2$, which yields:

$$Ksh = \frac{Zsh}{sL_1} = \frac{1}{1-\beta} \quad \text{Eq 8}$$

with $$\beta = H_2 \cdot K \cdot g$$

There are thus at least three strategies to realize a POTS splitter, depending on the choice of $sL_1$:

$$Ksh = \begin{cases} \ll 1 & \text{in Voice band} \\ = 1 & \text{in ADSL band} \end{cases} \text{for high value of } L_1 \quad \text{Eq 9}$$

$$Ksh = \begin{cases} < 1 & \text{in Voice band} \\ > 1 & \text{in ADSL band} \end{cases} \text{for medium value of } L_1$$

$$Ksh = \begin{cases} = 1 & \text{in Voice band} \\ \gg 1 & \text{in ADSL band} \end{cases} \text{for low value of } L_1$$

As a main target pursued in an embodiment of the disclosure is minimizing the splitter board space, the first choice is neglected while the third one is taken as a guideline.

The foregoing translates into the following condition:

$$\beta \approx 1 \text{ in the ADSL band} \quad \text{Eq 10}$$

Eq 9 and Eq 8 indicate $H_2$ will be a high pass filter (HPF). Moreover, its choice should be done in order to implement a G.992.1 compliant filtering action. The band limitation of K and g acts by switching off the synthesis outside the ADSL band reducing power consumption outside the frequency region of interest.

Synthesized impedance: this is the effective impedance seen around placed along the HV branch.

$$Zsh = n^2 \cdot (sL_2) \cdot Ksh = sL_1 \cdot Ksh \quad \text{Eq 11}$$

Zsh determines the active splitter performance in terms of return loss, insertion loss, attenuation distortion, delay distortion, ADSL band attenuation and input impedance (see e.g. ITU-T Recommendation G.992.1 (1999): "Asymmetric Digital Subscriber Line (ADSL)", which is incorporated by reference).

Current factor: this represents the ratio between the currents on the two windings and it is useful to determine the minimum current consumption of block g vs. the current flowing on the HV branch.

$$Ki = \frac{i_2}{i_1} = n \cdot \beta \cdot Ksh \quad \text{Eq 12}$$

Even if Ksh increases in the ADSL band, the current consumption $i_2$ is limited because the filtering action will simultaneously reduce $i_1$. This is directly proportional to the transformer ratio n.

Sensing factor: this is a useful parameter to provide the dynamic ranges of signal processed by the active chain vs. the current flowing on primary winding.

$$Ks = \frac{v_2}{i_1} = n \cdot (sL_2) \cdot Ksh = \frac{1}{n} \cdot (sL_1) \cdot Ksh = \frac{Zsh}{n} \quad \text{Eq 13}$$

As Zsh increases and n decreases, Ks will increase providing a greater signal on the active part. In any case, a decrement of $i_1$, which leads to a limited signal $v_2$, follows an increment of Ks in the ADSL band.

Out noise factor: this is useful in order to obtain the equivalent output noise generator (see FIG. 6) vs. the equivalent input noise of the active chain K, H, g.

$$Kn_{out} = \left|\frac{e_{no}}{e_{ni}}\right| = n \cdot |\beta \cdot Ksh| \quad \text{Eq 14}$$

Line noise factor: this is expressed as the ratio of the on-line injected noise to the equivalent input noise of the active chain including the elements K, H, g. Taking FIG. 7 again as a reference, ZA and ZB denote the impedances loading the nodes A and B, respectively.

The above-mentioned factor has the expression in Eq 15. This indicates that a certain care is required in properly selecting the transformer ratio n, as this may multiply the noise injected into node B, which may disturb the ADSL channel.

$$Kn_{line} = \left|\frac{e_{nline}}{e_{ni}}\right| = Kn_{out} \cdot \left|\frac{ZB}{ZA + ZB + Zsh}\right| \qquad \text{Eq 15}$$

The arrangement described in the foregoing has been tested by taking into account the following edging conditions, which consider the main transformer parasitics (leakage inductance and wire DC resistance), active blocks band limitations, and so on.

Additionally, H(s) was considered as notionally comprised of three stages: a high pass filter (HPF), a low pass filter (LPF) and a phase adjustment filter (PAD), while the following quantitative parameters have been used.

Transformer Parameters
$L_1$=20 mH (primary winding),
$L_2$=12 mH (secondary winding),
$R_w$=10Ω (DC resistance for each winding),
$L_{lk}$=20 uH (Leakage inductance),
External Capacitor
Cpots=100 nF (capacitor in parallel with the PTSN side),
Active Blocks Parameters $$K(f) = \frac{K_0}{1 + j^f/f_{pK}}$$

with $K_0$=950 and $f_{pK}$=3 MHz
which represent a distributed gain, $$g(f) = \frac{g_0}{1 + j^f/f_{pg}}$$

with $g_0$=1 mS and $f_{pg}$=500 KHz
$e_{ni}$=100 nV/√Hz (input equivalent noise of the active chain K, H, g),
With the above edging conditions a viable solution is:

$$H(s) = H_{2HPF}(s) \cdot H_{2LPF}(s) \cdot H_{2PAD}(s) \cdot H_1(s) \qquad \text{Eq 16}$$

With $$H_{2HPF}(s) = \frac{s^2 \cdot 9.0376 \cdot 10^{-1} + 1.6328 \cdot 10^8}{s^2 + s \cdot 2.1385 \cdot 10^4 + 7.4831 \cdot 10^9} \qquad \text{Eq 17}$$

$$H_{2LPF}(s) = \frac{5.2306 \cdot 10^7}{s + 5.2306 \cdot 10^7} \qquad \text{Eq 18}$$

$$H_{2PAD}(s) = 1 \qquad \text{Eq 19}$$

$$H_1(s) = \frac{s \cdot 1.1706 \cdot 10^{-2} + 5.6106 \cdot 10^3}{s \cdot 6.5560 \cdot 10^1 + 5.6006 \cdot 10^4} \qquad \text{Eq 20}$$

$H_{2HPF}$ is a second order elliptic high pass function with a cut-off frequency of 10 kHz and 44 dB attenuation. Instead $H_1$ is the function which compensate $sL_2$ in equation Eq 3.

From Eq 19, the PAD filter is unitary, given that no phase correction is needed for this kind of $H_{2HPF}$.

Other Configurations

Other topologies, again based on a transformer as the synthesis core, will now be briefly described in the following according to an embodiment of the disclosure.

A generalization of the idea previously described will be introduced first. A discussion of a different approach that uses an HV capacitor follows.

Embodiment Generalization

Figure 8:
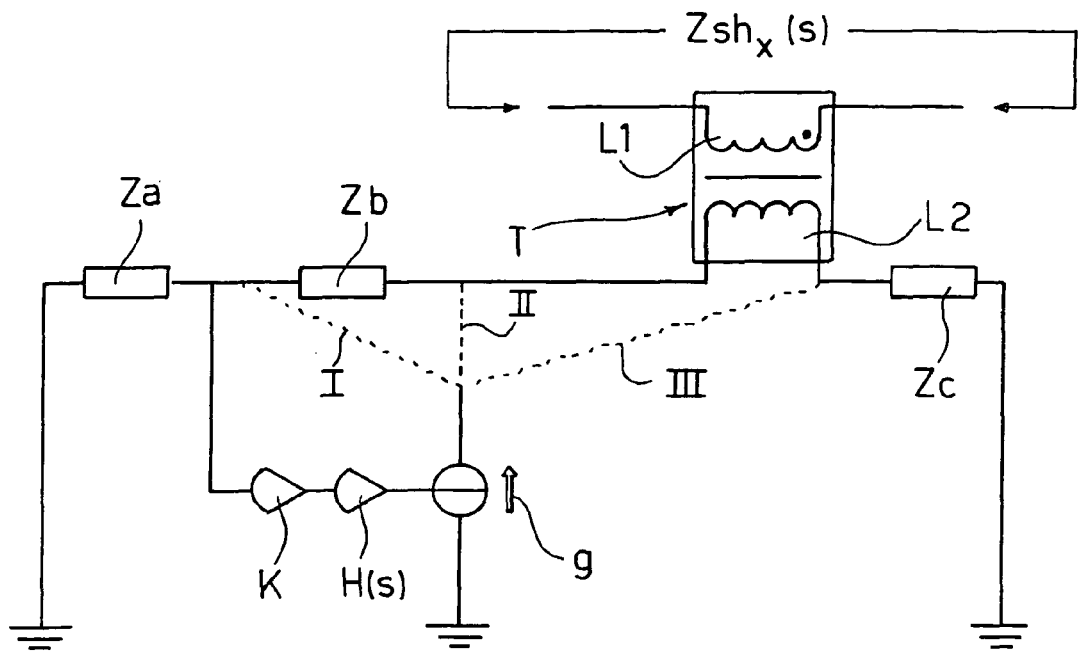
FIG. 8 is a block diagram exemplary of the general topology of the arrangement described herein according to an embodiment of the disclosure.

The embodiment described in the foregoing may be regarded as representative a more general topology as shown in FIG. 8. There, three impedances are added ($Z_a$, $Z_b$, $Z_c$) and three different injection points are considered (I, II, III). In that way, all possible sensing/injection combinations are realized by properly setting of the three added impedances.

The circuit in FIG. 8 provides an impedance $Zsh_x$ which can be expressed as:

$$Zsh_x = Zsh_0 \cdot Ksh_x \qquad \text{Eq 21}$$

where $Zsh_0$ is the impedance seen from the line when the synthesis is off:

$$Zsh_0 = \frac{L_1}{L_2} \cdot (Z_{abc} // sL_2) \qquad \text{Eq 22}$$

The impedances $Z_{abc}$ and $Z_{bc}$ are respectively defined as:

$$Z_{abc} = Z_a + Z_b + Z_c \text{ and } Z_{bc} = Z_b + Z_c \qquad \text{Eq 23}$$

The synthesis coefficients depend on the injection point, and they may be expressed as follows:

$$Ksh_I = \frac{1 - \alpha \cdot \left(Z_a \cdot \frac{Z_{bc}}{Z_{abc}}\right)}{1 - \alpha \cdot \left(Z_a \cdot \frac{Z_{bc} + sL_2}{Z_{abc} + sL_2}\right)} \qquad \text{Eq 24}$$

$$Ksh_{II} = \frac{1 - \alpha \cdot \left(Z_a \cdot \frac{Z_c}{Z_{abc}}\right)}{1 - \alpha \cdot \left(Z_a \cdot \frac{Z_c + sL_2}{Z_{abc} + sL_2}\right)} \qquad \text{Eq 25}$$

$$Ksh_{III} = \frac{1 - \alpha \cdot \left(Z_a \cdot \frac{Z_c}{Z_{abc}}\right)}{1 - \alpha \cdot \left(Z_a \cdot \frac{Z_c}{Z_{abc} + sL_2}\right)} \qquad \text{Eq 26}$$

or in a more generalized way:

$$Ksh_x = \frac{1 - \alpha \cdot Z_x^{num}(s)}{1 - \alpha \cdot Z_x^{den}(s)} \qquad \text{Eq 27}$$

x = I, II, III

This represents a key point underlying the arrangement described herein, namely sensing and injection have been done on the secondary winding side.

On-Line Current Sensing Approach

Figure 9:
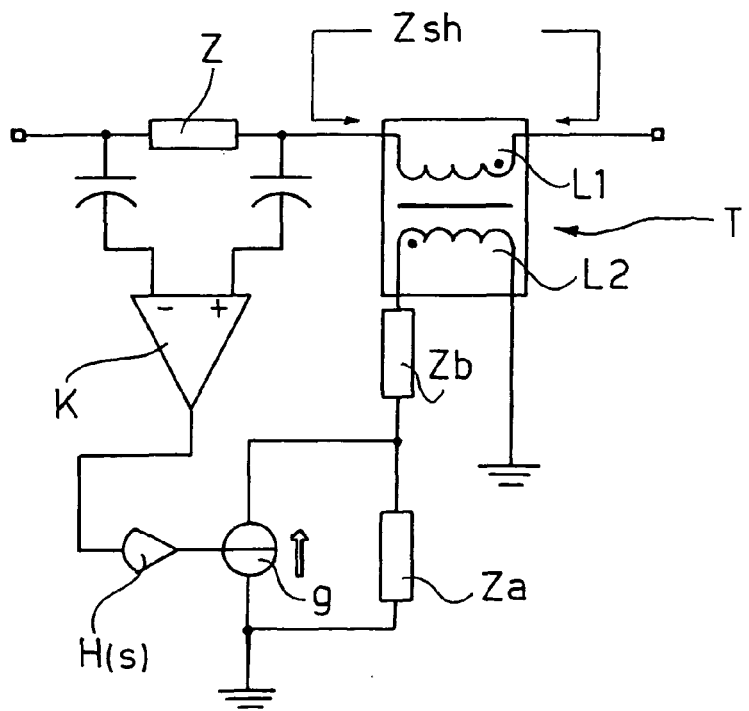
FIG. 9 is exemplary of a line current sensing approach for possible application to the arrangement described herein according to an embodiment of the disclosure.

The last-described approach is based on current sensing across an impedance Z placed in series with the line (see FIG. 9). Furthermore, capacitive decoupling allows using LV devices for circuitry coupled to the secondary winding. Analyzing the circuit we obtain the equations:

$$Zsh = Zsh_0 \cdot Ksh \quad \text{Eq 28}$$

$$Zsh_0 = \frac{L_1}{L_2} \cdot (Z_{ab} \, // \, sL_2) \quad \text{Eq 29}$$

$$Z_{ab} = Z_a + Z_b$$

$$Ksh = 1 + \alpha \cdot \left( \frac{Z_a Z \cdot sM}{Z_{ab} + sL_1} \right) \quad \text{Eq 30}$$

Ksh depends linearly on α, while the previous solutions (Eq 27) convey a hyperbolic relationship.

This solution exhibits a drawback with respect to the previous one due to the presence of HV capacitors and a component Z placed in series with the line, but presents an advantage given by its linear behavior with alpha.

In terms of stability, Eq 31 shows the open loop gain when terminals P and L are respectively loaded with $Z_P$ and $Z_L$; this formula shows that stability is not an issue when one/both terminals are floating.

$$G_{OL}(s) = -\alpha \cdot \left( \frac{Z_a Z \cdot sM}{Z_{ab} + sL_1} \right) \cdot \frac{1}{Z_P + Z_L + Z + Zsh_0} \quad \text{Eq 31}$$

As indicated, the arrangement described herein exhibits a number of advantages.

In filtering applications where HV signals are present, integration has heretofore met with serious obstacles due to taxing technology requirements and power consumption: in fact, the signal dynamics made it practically compulsory to use an HV supply for the active part, thus making design very expensive in terms of power dissipation.

The arrangement described herein achieves a reduction in the passive components needed in filtering applications like xDSL splitter. Using LV technology to integrate active devices, provides a high density solution in terms of area and cost: for instance, a high order filter can be implemented by means of an ASIC, a single transformer plus some SMD components, in the place of a huge transformers chain, thus achieving a substantial saving in PCB space.

A communication system may include one or more of the above-described topologies. Applications of the splitter other then telephone/DSL are also contemplated.

Of course, without prejudice to the underlying principles of the disclosure, the details and embodiments may vary, also significantly, with respect to what has been described, by way of example only, without departing from the scope of the disclosure as defined in the claims that follow.

What is claimed is:

1. An arrangement including:
a transformer having a primary winding and a secondary winding, the transformer having an impedance across said primary winding, and
an impedance synthesis circuit within an integrated circuit coupled to the transformer, the synthesis circuit including:
an adjustable transfer function element having an alterable frequency spectrum, said transfer function element having associated a gain element, the transfer function implemented without passive elements,
a digital interface coupled to the transfer function element for receiving a digital control signal configured to program the transfer function element with one of a plurality transfer functions such that the frequency spectrum is altered, and
a current source controlled by said transfer function element,
said impedance synthesis circuit connected to said secondary winding, wherein said transformer mirrors the impedance synthesized by said impedance synthesis circuit into said impedance across said primary winding.

2. The arrangement of claim 1 wherein said current source is controlled by said transfer function element via a feedback path and in that said associated gain element is a distributed gain over said feedback path.

3. The arrangement of claim 1, wherein said current source is connected to a current injection point selected out of:
either terminal of said secondary winding, and
a point connected to said secondary winding via an impedance.

4. The arrangement of claim 1, wherein said transfer function element is connected to sense voltage at said secondary winding.

5. The arrangement of claim 4 wherein said transfer function element is connected to a terminal of said secondary winding.

6. The arrangement of claim 4, wherein said transfer function element is connected to said secondary winding via said gain element.

7. The arrangement of claim 5, wherein said transfer function element is connected to said secondary winding via a voltage divider.

8. The arrangement of claim 4 wherein said transfer function element is connected for on-line sensing voltage across an impedance in series with said primary winding.

9. The arrangement of claim 1 wherein said current source is a voltage-controlled current source.

10. The arrangement of claim 1 wherein said transfer function element includes at least one filter dictating said frequency spectrum.

11. The arrangement of claim 10, wherein said transfer function element includes at least one high pass filter.

12. The arrangement of claim 10, wherein said transfer function element includes at least one phase adjustment filter.

13. The arrangement of claim 10, wherein said associated gain element and said current source provide a low-pass filtering action, whereby said transfer-function element is exempt from respective low-pass filter elements.

14. The arrangement of claim 11, wherein said at least one high-pass filter is an elliptic high pass filter.

15. The arrangement of claim 1 wherein said transfer function element is selectively controllable to selectively modify the frequency spectrum of said impedance synthesized by said impedance synthesis circuit and mirrored into said impedance across said primary winding.

16. The arrangement of claim 15 wherein said transfer function element is selectively controllable via a digital interface.

17. The arrangement of claim 1 wherein said impedance synthesis circuit is in the form of an integrated circuit.

18. The arrangement of claim 1 wherein said primary winding defines the high voltage side of an XDSL splitter.

19. The arrangement of claim 11 wherein said transfer-function element includes a high-pass filter implementing a high-pass function with a cut-off frequency of 10 kHz and 44 dB attenuation.

20. A filter, comprising:
a first filter signal node;
a second filter signal node;
a filter supply node;
a transformer including a first winding coupled between the first and second filter signal nodes and including a second winding having a first node coupled to the supply node and having a second node;

a current source having a control node and coupled between the supply node and the second node of the second winding; and a current-control stage on an integrated circuit chip having an input node coupled to the transformer and having an output node coupled to the control node of the current source, the current-control stage including an adjustable frequency-dependent transfer function configured to realize one of a finite number of discrete transfer functions having different frequency responses by a digital control signal.

21. The filter of claim 20 wherein the filter supply node comprises a ground node.

22. The filter of claim 20 wherein the current-control stage has a programmable transfer function.

23. The filter of claim 20 wherein the input node of the current-control stage is coupled to the second node of the second winding.

24. The filter of claim 20 wherein the input node of the current-control stage is coupled to one of the first and second filter signal nodes.

25. The filter of claim 20, further comprising a distributed gain between the second node of the second winding and the current-control stage.

26. The filter of claim 20, further comprising an impedance disposed between the supply node and the first node of the second winding.

27. The filter of claim 20, further comprising an impedance disposed between the supply node and the second node of the second winding.

28. The filter of claim 20, further comprising an impedance disposed between the second node of the second winding and the input node of the current-control stage.

29. The filter of claim 20, further comprising an impedance disposed between the second node of the second winding and the current source.

30. The filter of claim 20, further comprising an impedance disposed across the current source.

31. The filter of claim 20, further comprising a current sensor having an input node coupled to one of the first and second filter signal nodes and having an output node coupled to the input node of the current-control stage.

32. A filter disposed in an integrated circuit, comprising:
a first filter signal node;
a second filter signal node;
a filter supply node;
a transformer including a first winding coupled between the first and second filter signal nodes and including a second winding having a first node coupled to the filter supply node and having a second node; and
a controllable current source configured to operate according to one of a finite number of transfer functions coupled to the second winding and configured to control an impedance between the first and second filter signal nodes by generating a predetermined current through the second winding, each of the transfer functions comprising at least two different adjustable parameters.

33. The filter of claim 32 wherein the current source is configured to generate the current as a function of a signal between the first and second filter signal nodes.

34. A communication system, comprising:
a first transceiver configured to receive and transmit via a first transceiver node a first signal having a first frequency;
a second transceiver configured to receive and transmit via a second transceiver node a second signal having a second frequency that is higher than the first frequency; and
a signal splitter configured to impede propagation of the second signal to the first transceiver node, the splitter including,
a supply node,
a transformer including a first winding coupled between the first and second transceiver nodes and including a second winding having a first node coupled to the filter supply node and having a second node,
a current source having a control node and coupled between the supply node and the second winding node of the second winding, and
a current-control stage on an integrated circuit chip having an input node coupled to the transformer and having an output node coupled to the control node of the current source, the current control stage configured to realize one of a finite number of discrete transfer functions having different frequency responses by a digital control signal.

35. The communication system of claim 34 wherein:
the first transceiver comprises a telephone; and
the second transceiver comprises a digital-subscriber-line modem.

36. The communication system of claim 34 wherein:
the first transceiver comprises a central-office telephone circuit; and
the second transceiver comprises a central-office digital-subscriber-line circuit.

37. A method, comprising:
generating a voltage across nodes of a first winding of a transformer; and
generating a current through a second winding of the transformer to control an impedance between the nodes of the first winding, the current dependent upon one of a plurality of discrete functions of the frequency of the voltage across the nodes, each of the plurality of discrete functions comprising at least two different adjustable parameters controlled by active elements disposed on an integrated circuit.

38. The method of claim 37 wherein generating the current comprises generating the current as a function of a voltage across the first winding.

39. The method of claim 37 wherein generating the current comprises generating the current as a function of a current through the first winding.

40. The method of claim 37 wherein generating the current comprises generating the current as a function of a voltage across the second winding.

* * * * *